(12) United States Patent
Jeon

(10) Patent No.: US 8,629,458 B2
(45) Date of Patent: Jan. 14, 2014

(54) COMPOUND SEMICONDUCTOR LIGHT-EMITTING ELEMENT

(75) Inventor: Soo Kun Jeon, Gyeonggi-do (KR)

(73) Assignee: Semicon Light Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/642,637

(22) PCT Filed: Mar. 18, 2011

(86) PCT No.: PCT/KR2011/001875
§ 371 (c)(1),
(2), (4) Date: Nov. 5, 2012

(87) PCT Pub. No.: WO2011/132860
PCT Pub. Date: Oct. 27, 2011

(65) Prior Publication Data
US 2013/0049055 A1    Feb. 28, 2013

(30) Foreign Application Priority Data
Apr. 23, 2010  (KR) .......................... 10-2010-0037799

(51) Int. Cl.
*H01L 27/15*  (2006.01)
*H01L 31/12*  (2006.01)
*H01L 33/00*  (2010.01)

(52) U.S. Cl.
USPC  257/79; 257/431; 257/E33.001; 257/E31.127

(58) Field of Classification Search
USPC ................ 257/79, 81, 82, 431, 432, E33.001, 257/E31.127
See application file for complete search history.

(56) References Cited

U.S. PATENT DOCUMENTS

| | | | |
|---|---|---|---|
| 7,276,742 B2 | 10/2007 | Kohno et al. | |
| 8,399,944 B2* | 3/2013 | Kwak et al. | 257/432 |
| 2002/0024053 A1 | 2/2002 | Inoue et al. | |
| 2002/0081773 A1 | 6/2002 | Inoue et al. | |
| 2003/0006418 A1 | 1/2003 | Emerson et al. | |

FOREIGN PATENT DOCUMENTS

| | | |
|---|---|---|
| JP | 2001-230448 | 8/2001 |
| JP | 2002-009347 | 1/2002 |

OTHER PUBLICATIONS

International Search Report for PCT Application No. PCT/KR2011/001875 (published as WO 2011/132860), dated Nov. 28, 2011, 6 pages.

* cited by examiner

*Primary Examiner* — Hoai V Pham
(74) *Attorney, Agent, or Firm* — Harness, Dickey & Pierce, P.L.C.

(57) ABSTRACT

The present disclosure relates to a compound semiconductor light-emitting element comprising: a frame; an adhesive provided on the frame; a light-emitting part which is secured in position on the frame by means of the adhesive and which includes a substrate, a first compound semiconductor layer formed on the substrate and having a first type of conductivity, a second compound semiconductor layer having a second type of conductivity that is different from the first type of conductivity, and an active layer disposed between the first compound semiconductor layer and the second compound semiconductor layer to generate light via electron-hole recombination; and a spacer disposed between the light-emitting part and the frame to create a gap therebetween.

10 Claims, 4 Drawing Sheets

COMPOUND SEMICONDUCTOR LIGHT-EMITTING ELEMENT

CROSS-REFERENCE TO RELATED APPLICATIONS

This application is a U.S. national stage filing under 35 U.S.C. §371 of International Application No. PCT/KR2011/001875 filed Mar. 18, 2011, and claims priority to Korean Application No. 10-2010-0037799 Apr. 23, 2010. The disclosures of the aforementioned applications are incorporated herein by reference in their entireties.

FIELD

The present disclosure relates generally to a compound semiconductor light-emitting element and, more particularly, to a compound semiconductor light-emitting element with improved light extraction efficiency and heat dissipation efficiency.

Here, the compound semiconductor light-emitting element indicates a semiconductor optical element which generates light via electron-hole recombination, and one example is a III-nitride semiconductor light-emitting element. The III-nitride semiconductor consists of a compound containing $Al_{(x)}Ga_{(y)}In_{(1-x-y)}N$ ($0 \leq x \leq 1$, $0 \leq y \leq 1$, $0 \leq x+y \leq 1$). Another example is a GaAs semiconductor light-emitting element used for red light emission.

BACKGROUND

This section provides background information related to the present disclosure which is not necessarily prior art.

FIG. 1 is a view showing an example of a conventional III-nitride semiconductor light-emitting element. The III-nitride semiconductor light-emitting element includes a substrate 10, a buffer layer 20 grown on the substrate 10, an n-type III-nitride semiconductor layer 30 grown on the buffer layer 20, an active layer 40 grown on the n-type III-nitride semiconductor layer 30, a p-type III-nitride semiconductor layer 50 grown on the active layer 40, a current spreading electrode 60 formed on the p-type III-nitride semiconductor layer 50, a p-side pad electrode 70 formed on the current spreading electrode 60, an n-side electrode 80 formed on the n-type III-nitride semiconductor layer 30 exposed by mesa-etching the p-type III-nitride semiconductor layer 50 and the active layer 40, and a protective film 90.

With regard to the substrate 10, a GaN-based substrate may be used as a homo-substrate, and a sapphire substrate, a SiC substrate, a Si substrate or the like may be used as a hetero-substrate. However, any type of substrate may be employed as far as it can have a III-nitride semiconductor layer grown thereon. If the SiC substrate is used, the n-side electrode 80 can be formed on the SiC substrate-side.

FIG. 2 is a view showing an example of a conventional method of mounting the light-emitting element on a frame 5. The light-emitting element is secured to the frame 5 by means of an adhesive 9 such as Ag paste. Some of the light generated in the active layer 40 is directly emitted through the light-transmissive current spreading electrode 60, while light penetrating the substrate 10 is reflected on an Al layer 92 and emitted through the current spreading electrode 60 or the side surfaces of the light-emitting element.

The light-emitting element, which is a compound semiconductor light-emitting element, is very thin and is bonded to the adhesive 9 provided on the frame 5. Therefore, according to the conventional method of mounting the light-emitting element, as shown in a dotted-line circle 7 of FIG. 2, the adhesive 9 ascends to the side surfaces of the substrate 10. The adhesive 9, which may be opaque, absorbs some of the light introduced into the substrate. Even if the adhesive 9 is transparent, it still absorbs the light (though there is a difference in amount). As a result, the amount of light emitted from the light-emitting element decreases, which leads to low light extraction efficiency of the light-emitting element.

DETAILED DESCRIPTION

Technical Problem

The problems to be solved by the present disclosure will be described in the latter part of the best mode for carrying out the invention.

Solution

This section provides a general summary of the disclosure and is not a comprehensive disclosure of its full scope or all of its features.

According to one aspect of the present disclosure, there is provided a compound semiconductor light-emitting element comprising: a frame; an adhesive provided on the frame; a light-emitting part which is secured in position on the frame by means of the adhesive and which includes a substrate, a first compound semiconductor layer formed on the substrate and having a first type of conductivity, a second compound semiconductor layer having a second type of conductivity that is different from the first type of conductivity, and an active layer disposed between the first compound semiconductor layer and the second compound semiconductor layer to generate light via electron-hole recombination; and a spacer disposed between the light-emitting part and the frame to create a gap therebetween.

Advantageous Effects

The advantageous effects of the present disclosure will be described in the latter part of the best mode for carrying out the invention.

MODE FOR CARRYING OUT THE INVENTION

The present disclosure will now be described in detail with reference to the accompanying drawings.

A compound semiconductor light-emitting element according to the present disclosure includes a frame, an adhesive, a light-emitting part, and a spacer. The light-emitting part will be described first, and then the frame, the adhesive and the spacer will be described.

Figure 1:
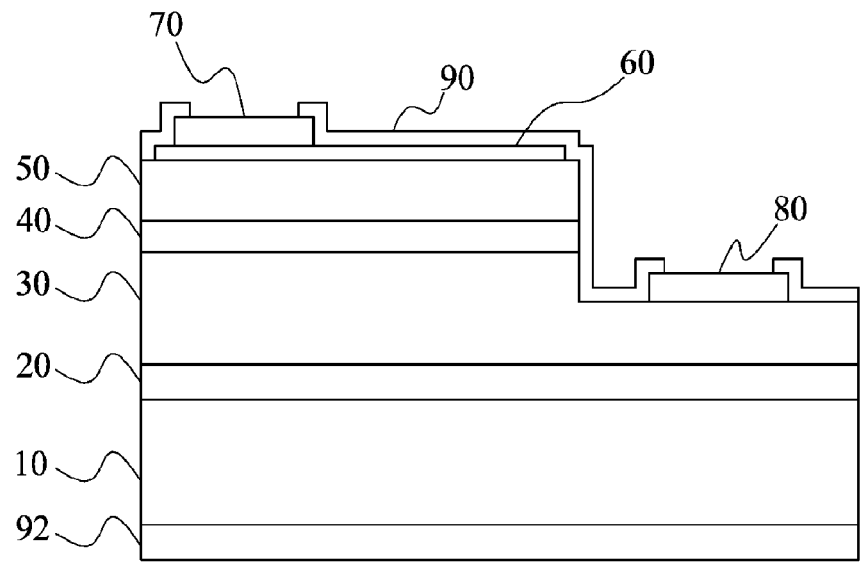
FIG. 1 is a view showing an example of a conventional III-nitride semiconductor light-emitting element.
Figure 2:
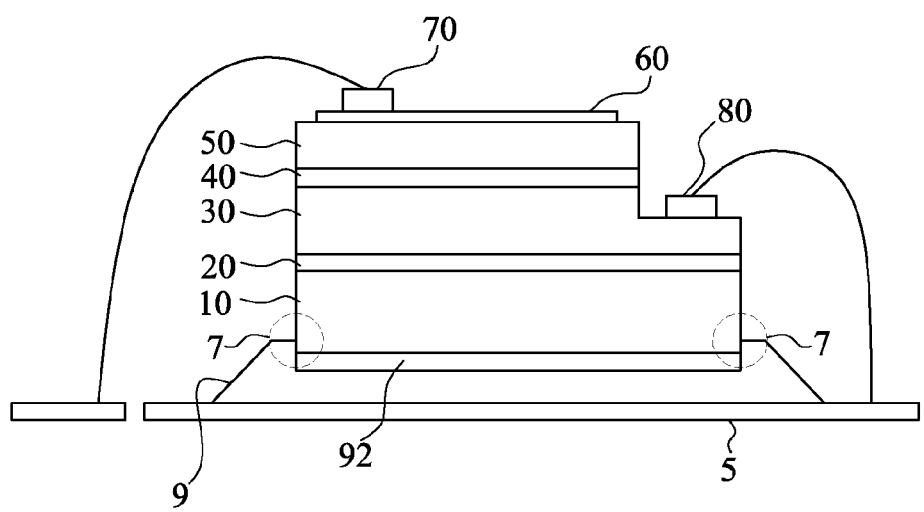
FIG. 2 is a view showing an example of a method of mounting the conventional III-nitride semiconductor light-emitting element to the frame.
Figure 3:
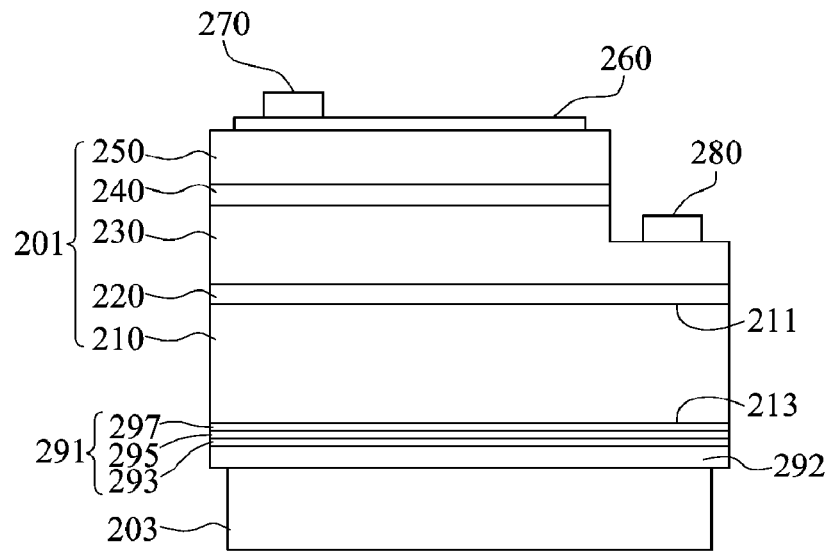
FIG. 3 is a view showing an example of a light-emitting part having a spacer according to the present disclosure.

FIG. 3 is a view showing an example of the light-emitting part having the spacer according to the present disclosure.

The light-emitting part 201 shown in FIG. 3 includes a substrate 210, a first compound semiconductor layer, a second compound semiconductor layer, and an active layer 240.

The first compound semiconductor layer, the active layer 240 and the second compound semiconductor layer are formed on the top surface 211 of the substrate 210. One example of the substrate 210 is an $Al_2O_3$ substrate which is an insulating substrate. The first compound semiconductor layer and the second compound semiconductor layer may include III-nitride semiconductor layers, wherein the first compound semiconductor layer may include an n-type III-nitride semiconductor layer 230, and the second compound semiconductor layer may include a p-type III-nitride semiconductor layer 250. It is preferable that a buffer layer 220 be formed prior to the n-type III-nitride semiconductor layer 230.

Next, some portions of the n-type III-nitride semiconductor layer 230, the active layer 240 and the p-type III-nitride semiconductor layer 250 are removed via an etching process. The etching process is performed via a dry etching, such as RIE, RIBE, ICP, or the like.

The compound semiconductor light-emitting element further includes an n-side electrode 280, a current spreading electrode 260, and a p-side pad electrode 270.

The current spreading electrode 260, the p-side pad electrode 270 and the n-side electrode 280 are formed via a photolithography process. The current spreading electrode 260 may serve as a light-transmissive electrode made of a substance, such as ITO. The p-side pad electrode 270 and the n-side electrode 280 may be made of Cr, Ti, Al, Pt, Au, TiW, Ni, Cu, or any combination thereof.

The compound semiconductor light-emitting element may further include at least one dielectric substance layer 291 and a light reflective layer 292. The dielectric substance layer 291 and the light reflective layer 292 are formed on the bottom surface 213 of the substrate 210 to improve light extraction efficiency of the compound semiconductor light-emitting element.

The at least one dielectric material layer 291 may include, for example, a first $SiO_2$ layer 293, a $TiO_2$ layer 295, and a second $SiO_2$ layer 297, which are sequentially stacked on the bottom surface 213 of the substrate 210. The first $SiO_2$ layer 293, the $TiO_2$ layer 295 and the second $SiO_2$ layer 297 can be deposited in an E-beam evaporator. It is possible to vary the number and thickness of the plurality of dielectric material layers 291 so as to improve reflection efficiency dependent upon an incident angle of light relative to the light reflective layer 292 and reflection efficiency dependent upon wavelengths of light.

The light reflective layer 292 is formed on the dielectric material layer 291 to reflect light transmitted through the dielectric material layer 291. The light reflective layer 292 may be made of a metal of excellent reflectivity, such as Al. The light reflective layer 292 can be formed by plating or deposition.

The spacer 203 is formed on the light reflective layer 292. A protective layer (not shown) may be further provided between the spacer 203 and the light reflective layer 292 so as to prevent oxidation of the light reflective layer 292. It is preferable that the spacer 203 be formed in a region corresponding to an individual chip, instead of being formed on the entire surface of the substrate 210, to facilitate a (scribing or breaking) process of separating the compound semiconductor light-emitting element into individual chips. For this purpose, a photoresist layer (not shown) may be formed on the bottom surface of the light reflective layer 292, with the region corresponding to the individual chip being open. Then, the spacer 203 can be formed only in the region corresponding to the individual chip by using the photoresist layer as a mask. After the spacer 203 is formed, the photoresist layer may or may not be eliminated.

If the spacer 203 is made of a conductive substance, it may include single or plural plating layers. Exemplary plating materials include Cu, Ni, Au, Ag, Al, etc. The plating material can be determined according to the properties of the light reflective layer 292, the properties of the adhesive, the conditions of the plating process, etc. Exemplary plating methods include electro-plating and electroless plating. The spacer 203 may be much thicker than the light reflective layer 292 to prevent the adhesive from ascending to the side surfaces of the substrate 210, and its thickness preferably ranges from 20 μm to 80 μm. If the thickness of the spacer 203 is smaller than 20 μm, it is difficult to efficiently prevent the adhesive from ascending to the side surfaces of the substrate 210. If the thickness of the spacer 203 is greater than 80 μm, it is difficult to firmly secure the light-emitting part 201 to the frame (discussed later) by means of the adhesive.

Figure 4:
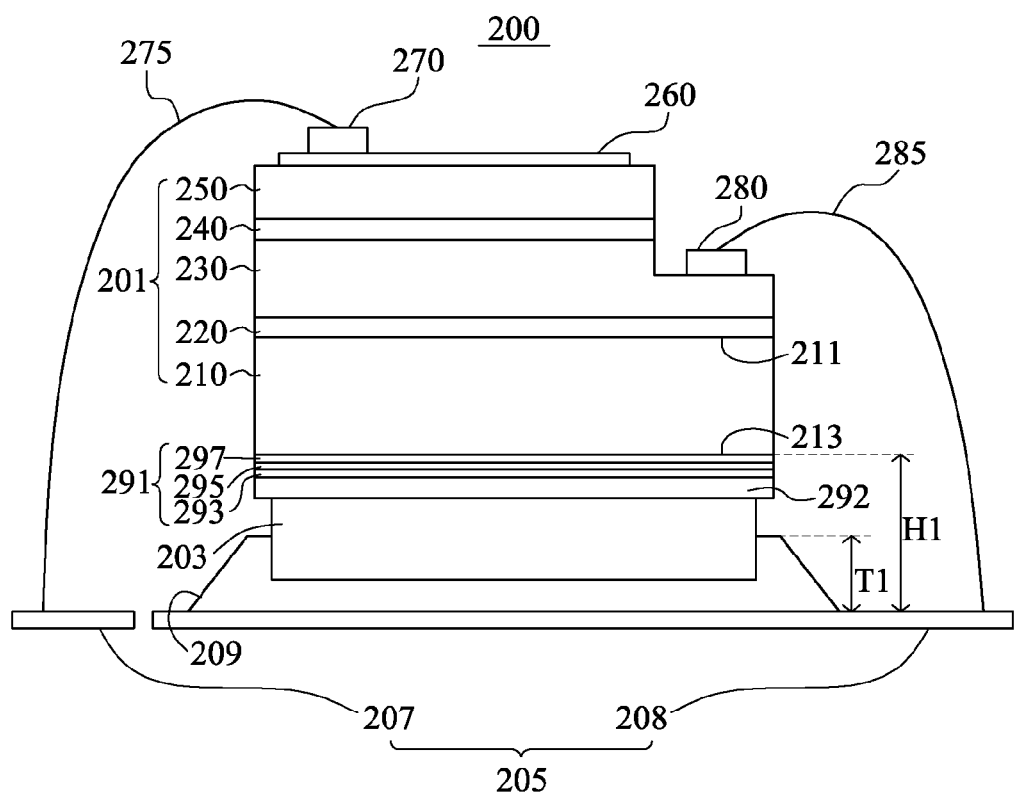
FIG. 4 is a view showing an embodiment of a compound semiconductor light-emitting element which includes the light-emitting part having the spacer shown in FIG. 3.

FIG. 4 is a view showing an embodiment of the compound semiconductor light-emitting element which includes the light-emitting part having the spacer shown in FIG. 3.

Referring to FIG. 4, the spacer 203 is bonded to the adhesive 209 provided on the frame 205, and the light-emitting part 201 is secured in position on the frame 205.

The frame 205 may be formed of a metal material. The frame 205 may include lead electrodes which apply a driving current to the light-emitting part 201. For example, in FIG. 4, the frame 205 may include a first lead electrode 208, which is provided with the adhesive 209 and electrically connected to the n-side electrode 280 by a first wire 285, and a second lead electrode 207, which is electrically connected to the p-side pad electrode 270 by a second wire 275. Alternatively, the frame 205 may be a printed circuit board. A plurality of light-emitting parts 201 may be surface-mounted on the printed circuit board. Connection portions, which are electrically connected to the light-emitting parts 201, may be formed on the printed circuit board.

The adhesive 209 may be a conductive paste. For example, the conductive paste includes an Ag paste. Alternatively, the adhesive 209 may be a photocurable resin such as epoxy or acryl. The type of the adhesive 209 can be determined considering to the material of the spacer 203, the material of the frame 205, the type of the light-emitting part 201, the necessity of electrical conduction, etc.

The light-emitting part 201 is aligned on the adhesive 209 provided on the frame 205 and pressed so that the spacer 203 can be bonded to the non-hardened adhesive 209. Then, when the adhesive 209 is hardened, the spacer 203 is secured in position. As illustrated in FIG. 4, at least some portion of the spacer 203 is immersed in the adhesive 209. It is preferable that the height H1 from the frame 205 to the bottom surface 213 of the substrate 210 be equal to or larger than the thickness T1 of the hardened adhesive 209. As such, the adhesive 209 cannot ascend to the side surfaces of the substrate 210 and may be positioned under the light reflective layer 292 or brought into contact with it.

Some of the light generated in the active layer 240 is directly emitted through the light-transmissive current spreading electrode 260. Some of the light is introduced into the substrate 210, and then emitted through the side surfaces of the substrate 210 or, after being reflected on the light reflective layer 292, emitted through the side surfaces of the substrate 210 or the current spreading electrode 260. As the adhesive 209 does not ascend to the side surfaces of the substrate 210, it does not absorb light. Consequently, the amount of light emitted from the compound semiconductor light-emitting element 200 increases, which leads to high light extraction efficiency.

In addition, the contact area between the spacer 203 and the adhesive 209 is large. Thus, heat generated in the light-emitting part 201 can be more rapidly discharged in large quantities through the spacer 203, the adhesive 209, and the frame 205. This improves light emission efficiency of the compound semiconductor light-emitting element 200.

Figure 5:
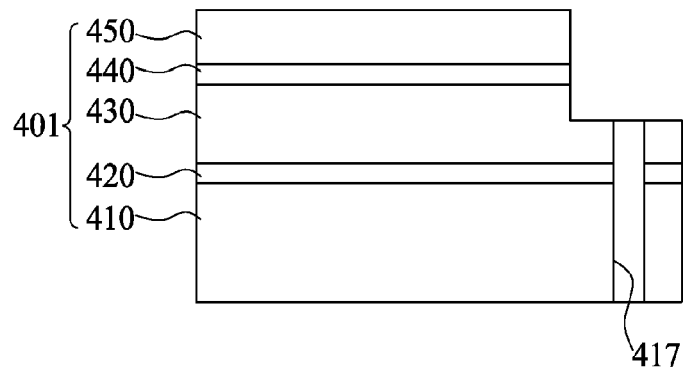
FIGS. 5 and 6 are views showing another example of the light-emitting part having the spacer according to the present disclosure.
Figure 6:
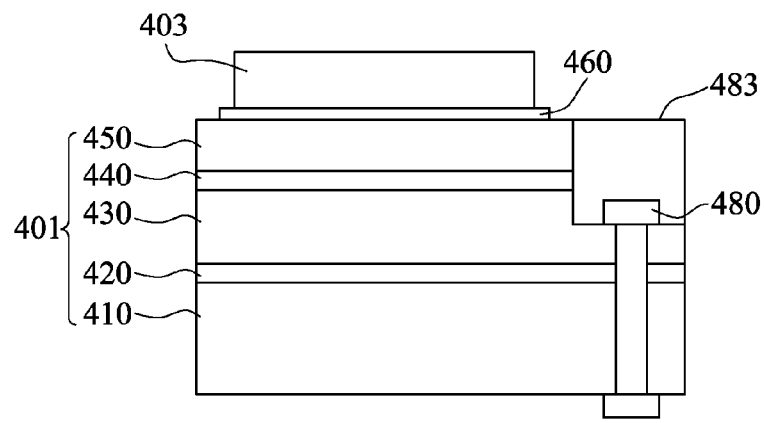

FIGS. 5 and 6 are views showing another example of the light-emitting part having the spacer according to the present disclosure.

In FIG. 5, the light-emitting part 401 includes a substrate 410, a buffer layer 420, an n-type III-nitride semiconductor layer 430, an active layer 440, and a p-type III-nitride semiconductor layer 450. Some portions of the p-type III-nitride semiconductor layer 450 and the active layer 440 are etched so that the n-type III-nitride semiconductor layer 430 is partially exposed. A hole 417 is formed in the substrate 410. The hole 417 leads from the bottom surface of the substrate 410 to the n-type III-nitride semiconductor layer 430. The hole 417 can be formed by laser cutting using a diode-pumped (UV) laser.

Referring to FIG. 6, the compound semiconductor light-emitting element further includes a current spreading electrode 460, an n-side electrode 480, and an insulating layer 483.

The current spreading electrode 460 is formed on the p-type III-nitride semiconductor layer 450. The current spreading electrode 460 serves as a light reflective layer in addition to the current spreading function. The current spreading electrode 460 may be made of Cr, Ti, Al, Pt, Au, TiW, Ni, Cu, or any combination thereof. The n-side electrode 480 may be formed on the etched and exposed n-type III-nitride semiconductor layer 430 and made of Cr, Ti, Al, Pt, Au, TiW, Ni, Cu, or any combination thereof. The n-side electrode 480 can be connected to the hole 417 via a plating process using Cu and extended to the bottom surface of the substrate 410 using Al. A current can be applied to the n-side electrode 480 extended to the bottom surface of the substrate 410. The insulating layer 483 is formed on the exposed n-type III-nitride semiconductor layer 430 to insulate the n-side electrode 480 and the n-type III-nitride semiconductor layer 430. The insulating layer 483 may be made of $SiO_2$ or photoresist, for example.

Then, the spacer 403 is formed on the side of the current spreading electrode 460. The spacer 403 shown in FIG. 6 may be made of a conductive material and include single or plural plating layers. The material, shape and forming method of the spacer 403 are substantially identical to those described with reference to FIGS. 3 and 4. Thus, a detailed description thereof will be omitted.

Figure 7:
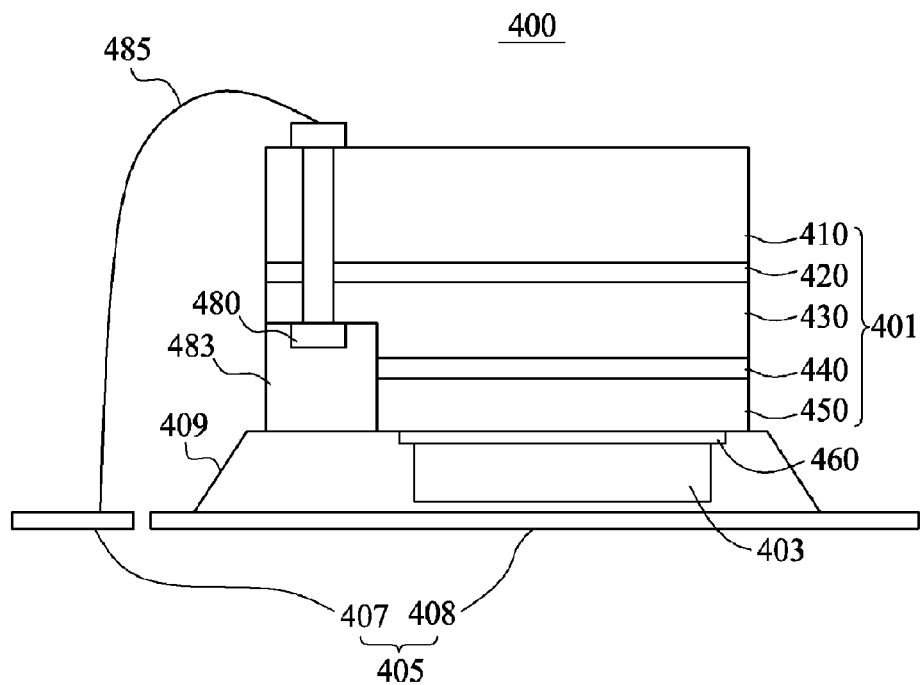
FIG. 7 is a view showing another embodiment of the compound semiconductor light-emitting element which includes the light-emitting part having the spacer shown in FIG. 6.

FIG. 7 is a view showing another embodiment of the compound semiconductor light-emitting element which includes the light-emitting part having the spacer shown in FIG. 6.

Referring to FIG. 7, the spacer 403 is bonded to the adhesive 409 provided on the frame 405, and the light-emitting part 401 is secured in position to the frame 405. Thus, the light-emitting part 401 is disposed upside down. Some of the light generated in the active layer 440 is reflected on the current spreading electrode 460 and emitted through the substrate 410. The insulating layer 483 insulates the n-side electrode 480 from the adhesive 409. The frame 405 includes a first lead electrode 408, which is provided with the adhesive 409 and electrically conducted to the current spreading electrode 460, and a second lead electrode 407, which is electrically connected to the n-side electrode 480 by a wire 485.

As shown in FIG. 7, the spacer 403 may be entirely immersed in the adhesive 409. As the spacer 403 creates a gap between the frame 405 and the light-emitting part 401, the adhesive 409 is prevented from ascending to the side surfaces of the light-emitting part 401. As a result, the adhesive 409 does not absorb the light emitted through the side surfaces of the light-emitting part 401, such that the amount of the light emitted from the light-emitting element 400 increases. Moreover, the spacer 403 also improves heat dissipation efficiency of the light-emitting element 400.

Figure 8:
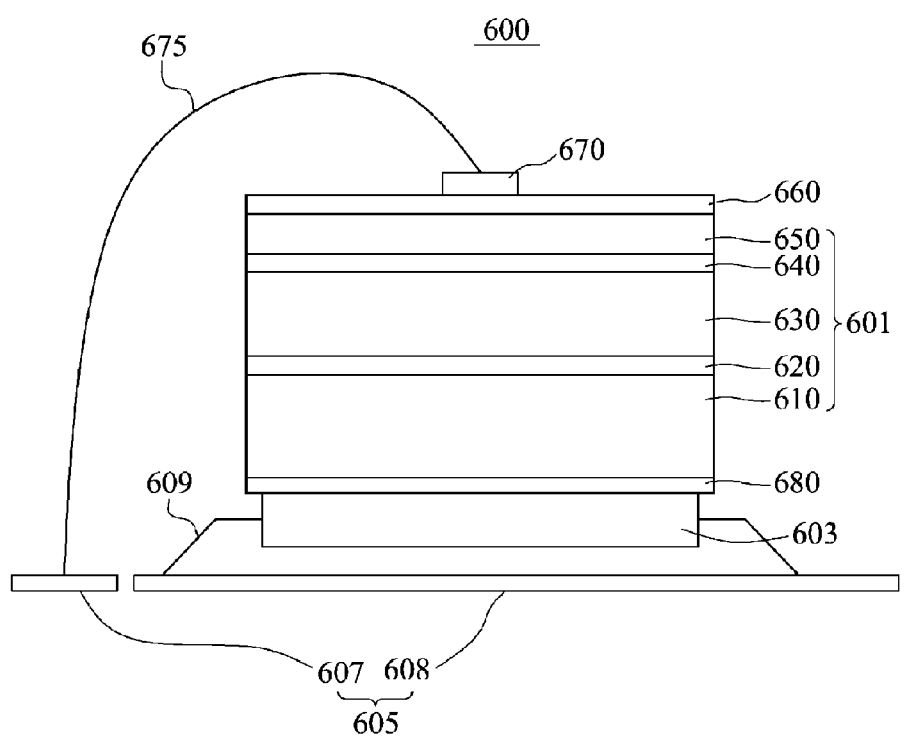
FIG. 8 is a view showing a further embodiment of the compound semiconductor light-emitting element according to the present disclosure.

FIG. 8 is a view showing a further embodiment of the compound semiconductor light-emitting element according to the present disclosure.

Referring to FIG. 8, the compound semiconductor light-emitting element 600 includes a frame 605, an adhesive 609, a light-emitting part 601, and a spacer 603.

The light-emitting part 601 includes a substrate 605, a buffer layer 620, an n-type III-nitride semiconductor layer 630, an active layer 640, and a p-type III-nitride semiconductor layer 650. The substrate may be made of sapphire, SiC, ZnO, Si, GaAs, or the like.

The compound semiconductor light-emitting element 600 may further include a current spreading electrode 660, a p-side pad electrode 670, and an n-side electrode 680.

The current spreading electrode 660, which is light-transmissive, is formed on the p-type III-nitride semiconductor layer 650. The p-side pad electrode 670 is formed on the current spreading electrode 660. The n-side electrode 680 is formed on the bottom surface of the substrate 610 to serve as a reflection plate. If the n-side electrode 680 serves as the reflection plate, a layer (not shown) made of $SiO_2$, $TiO_2$, CaF, MgF or the like is introduced between the substrate 610 and the n-side electrode 680, thus improving light extraction efficiency of the compound semiconductor light-emitting element 600.

If the substrate 610 has electric conductivity, the n-side electrode 680 can be electrically connected to the n-type III-nitride semiconductor layer 630 through the substrate 610. Alternatively, if the substrate 610 does not have electric conductivity, a hole can be formed in the substrate 610, and the n-side electrode 680 can be electrically connected to the n-type III-nitride semiconductor layer 630 through the hole.

The spacer 603 is formed on the side of the n-side electrode 680. The spacer 603 shown in FIG. 8 may be made of a conductive material and include single or plural plating layers. The material, shape and forming method of the spacer 603 are substantially identical to those described with reference to FIGS. 3 and 4. Thus, a detailed description thereof will be omitted.

The spacer 603 is bonded to the adhesive 609 provided on the frame 605, and the light-emitting part 601 is secured in position to the frame 605. Some of the light generated in the active layer 640 is reflected on the n-side electrode 680 and emitted through the current spreading electrode 660. The adhesive 609 may include a conductive paste. The frame 605 includes a first lead electrode 608, which is provided with the adhesive 609 and electrically conducted to the n-side electrode 680, and a second lead electrode 607, which is electrically connected to the p-side pad electrode 670 by a wire 675.

As the spacer 603 creates a gap between the frame 605 and the light-emitting part 601, the adhesive 609 is prevented from ascending to the side surfaces of the light-emitting part 601. As a result, the adhesive 609 does not absorb the light emitted through the side surfaces of the light-emitting part 601, such that the amount of the light emitted from the compound semiconductor light-emitting element 600 increases. Moreover, the spacer 603 also improves heat dissipation efficiency of the compound semiconductor light-emitting element 600.

Hereinafter, various exemplary embodiments of the present disclosure will be described.

(1) The compound semiconductor light-emitting element, wherein the spacer is bonded to the adhesive, and a spacing between the frame and the bottom surface of the substrate is equal to or larger than the height of the adhesive from the frame.

(2) The compound semiconductor light-emitting element, wherein the spacer comprises a plating layer.

As mentioned above, the spacer may be made of a metal. Alternatively, the spacer may be made of a non-conductive material. For example, a photoresist layer may be formed only in the region corresponding to the individual chip of the compound semiconductor light-emitting element on the bottom surface of the substrate. In this case, the number of processes for forming the spacer may be decreased.

(3) The compound semiconductor light-emitting element, wherein the spacer has a thickness of 20 μm to 80 μm.

(4) The compound semiconductor light-emitting element, further comprising a light reflective layer disposed between the light-emitting part and the spacer to reflect light.

(5) The compound semiconductor light-emitting element, wherein the light reflective layer is formed on the bottom surface of the substrate, and the compound semiconductor light-emitting element further comprises: a dielectric substance layer formed between the bottom surface of the substrate and the light reflective layer; an n-side electrode formed on the first compound semiconductor layer exposed by etching the second compound semiconductor layer and the active layer; a light-transmissive current spreading electrode formed on the second compound semiconductor layer; and a p-side pad electrode formed on the current spreading electrode.

(6) The compound semiconductor light-emitting element, wherein the substrate is a sapphire substrate, the spacer comprises a plating layer formed on the bottom surface of the light reflective layer, the first compound semiconductor layer comprises an n-type III-nitride semiconductor layer, and the second compound semiconductor layer comprises a p-type III-nitride semiconductor layer.

(7) The compound semiconductor light-emitting element, wherein the light reflective layer comprises an n-side electrode formed on the bottom surface of the substrate, and the spacer comprises a plating layer formed on the bottom surface of the light reflective layer.

Unlike the compound semiconductor light-emitting element described with reference to FIG. 8, the substrate may be omitted and the n-side electrode is formed on the bottom surface of the n-type III-nitride semiconductor layer to serve as a reflection plate. In this case, to increase the thickness of the spacer, a plurality of plating layers may be formed first on the n-side electrode and then a photoresist layer may be formed on the plating layers.

(8) The compound semiconductor light-emitting element, wherein the second compound semiconductor layer is disposed between the spacer and the active layer, and the compound semiconductor light-emitting element further comprises: a light-reflective current spread electrode disposed between the spacer and the second compound semiconductor layer; and an n-side electrode electrically connected to the first compound semiconductor layer.

(9) The compound semiconductor light-emitting element, wherein a hole is formed that leads from the bottom surface of the substrate to the first compound semiconductor layer, and the n-side electrode is formed on the first compound semiconductor layer, which is exposed by etching the second compound semiconductor layer and the active layer, and extended to the bottom surface of the substrate through the hole.

The present disclosure provides a compound semiconductor light-emitting element with improved light extraction efficiency by preventing an adhesive from absorbing light.

In addition, the present disclosure provides a compound semiconductor light-emitting element with improved heat dissipation efficiency by using a spacer having a large surface area.

What is claimed is:

1. A compound semiconductor light-emitting element, comprising:
    a frame;
    an adhesive provided on the frame;
    a light-emitting part which is secured in position on the frame by means of the adhesive and which includes a substrate, a first compound semiconductor layer formed on the substrate and having a first type of conductivity, a second compound semiconductor layer having a second type of conductivity that is different from the first type of conductivity, and an active layer disposed between the first compound semiconductor layer and the second compound semiconductor layer to generate light via electron-hole recombination; and
    a spacer disposed between the light-emitting part and the frame to create a gap therebetween.

2. The compound semiconductor light-emitting element of claim 1, wherein the spacer is bonded to the adhesive, and a spacing between the frame and the bottom surface of the substrate is equal to or larger than the height of the adhesive from the frame.

3. The compound semiconductor light-emitting element of claim 2, wherein the spacer comprises a plating layer.

4. The compound semiconductor light-emitting element of claim 3, wherein the spacer has a thickness of 20 μm to 80 μm.

5. The compound semiconductor light-emitting element of claim 1, further comprising a light reflective layer disposed between the light-emitting part and the spacer to reflect light.

6. The compound semiconductor light-emitting element of claim 5, wherein the light reflective layer is formed on the bottom surface of the substrate, and the compound semiconductor light-emitting element further comprises:
    a dielectric substance layer formed between the bottom surface of the substrate and the light reflective layer;
    an n-side electrode formed on the first compound semiconductor layer exposed by etching the second compound semiconductor layer and the active layer;
    a light-transmissive current spreading electrode formed on the second compound semiconductor layer; and
    a p-side pad electrode formed on the current spreading electrode.

7. The compound semiconductor light-emitting element of claim 6, wherein the substrate is a sapphire substrate, the spacer comprises a plating layer formed on the bottom surface of the light reflective layer, the first compound semiconductor layer comprises an n-type III-nitride semiconductor layer, and the second compound semiconductor layer comprises a p-type III-nitride semiconductor layer.

8. The compound semiconductor light-emitting element of claim 5, wherein the light reflective layer comprises an n-side electrode formed on the bottom surface of the substrate, and the spacer comprises a plating layer formed on the bottom surface of the light reflective layer.

9. The compound semiconductor light-emitting element of claim 1, wherein the second compound semiconductor layer is disposed between the spacer and the active layer, and the compound semiconductor light-emitting element further comprises:
   a light-reflective current spread electrode disposed between the spacer and the second compound semiconductor layer; and
   an n-side electrode electrically connected to the first compound semiconductor layer.

10. The compound semiconductor light-emitting element of claim 9, wherein a hole is formed that leads from the bottom surface of the substrate to the first compound semiconductor layer, and the n-side electrode is formed on the first compound semiconductor layer, which is exposed by etching the second compound semiconductor layer and the active layer, and extended to the bottom surface of the substrate through the hole.

* * * * *